United States Patent [19]

Dorri et al.

[11] Patent Number: 5,539,366
[45] Date of Patent: Jul. 23, 1996

[54] MAGNET HAVING CONTOURED POLE FACES FOR MAGNETIC FIELD HOMOGENEITY

[75] Inventors: Bizhan Dorri, Clifton Park; Evangelos T. Laskaris, Schenectady; Michele D. Ogle, Burnt Hills, all of N.Y.; Bu-Xin Xu, Florence, S.C.

[73] Assignee: General Electric Company, Milwaukee, Wis.

[21] Appl. No.: 281,044

[22] Filed: Jul. 27, 1994

[51] Int. Cl.⁶ .................................. H01F 3/00; G01V 3/00
[52] U.S. Cl. ..................... 335/297; 324/318; 324/320; 324/319; 335/216
[58] Field of Search .......................... 335/216, 296–306; 324/318–320

[56] References Cited

U.S. PATENT DOCUMENTS

| | | |
|---|---|---|
| 4,682,111 | 7/1987 | Hughes . |
| 4,818,966 | 4/1989 | Miyamato et al. . |
| 4,924,198 | 5/1990 | Laskaris . |
| 4,985,678 | 1/1991 | Gangarosa et al. . |
| 5,003,266 | 3/1991 | Palkovich et al. . |
| 5,045,794 | 9/1991 | Dorri et al. . |
| 5,124,651 | 6/1992 | Danby et al. . |
| 5,134,374 | 7/1992 | Breneman et al. . |
| 5,194,810 | 3/1993 | Breneman et al. . |
| 5,317,298 | 5/1994 | Dorri et al. . |

OTHER PUBLICATIONS

Concurrently filed patent application RD–23784, by Bizhan Dorri et al., entitled "Magnet Having Pole Faces With Trapezoidal-Shaped Shims".

U.S. Patent Application Docket No. RD–23769FW, filed on or about Jul. 11, 1994, (Ser. No. not yet received) by M. V. Chari, entitled "Open (Non-Enclosed) Magnets For Magnetic Resonance Imaging".

U.S. Patent Application Serial No. 08/067,183, filed May 26, 1993, by Dorri et al., entitled "Pole Face Design For A C-Shaped Superconducting Magnet".

*Primary Examiner*—Leo P. Picard
*Assistant Examiner*—Raymond M. Barrera
*Attorney, Agent, or Firm*—Irving M. Freedman; John H. Pilarski

[57] ABSTRACT

A magnet including spaced-apart first and second pole pieces with generally opposing first and second pole faces. The first pole face has an axis extending generally towards the second pole face and has a surface region which includes at least two frustoconical surfaces. The frustoconical surfaces are generally coaxially aligned about the axis, and radially-adjacent frustoconical surfaces abut each other. In a second embodiment, points on the surface region located an identical radial distance from the axis are also located a common axial distance along the axis, and a graph of axial distance along the axis versus radial distance from the axis for such points is a curve having a continuous slope with at least two sign reversals. Such contoured pole faces allow for a smoother magnetic field to better reduce axisymmetric magnetic field inhomogeneity.

12 Claims, 5 Drawing Sheets

5,539,366

MAGNET HAVING CONTOURED POLE FACES FOR MAGNETIC FIELD HOMOGENEITY

BACKGROUND OF THE INVENTION

The present invention relates generally to magnets, and more particularly to reducing axisymmetric magnetic field inhomogeneity in a magnet having opposing pole pieces.

Magnets include those having spaced-apart first and second pole pieces with generally opposing first and second pole faces, such as (but not limited to) "C"-shaped magnets. Some magnet applications, such as magnetic resonance imaging (MRI) for medical diagnostics, employ superconducting magnets to generate a high strength magnetic field within an imaging volume. The imaging volume must have a low magnetic field inhomogeneity for high quality imaging. Known techniques for reducing the magnetic field inhomogeneity within the imaging volume include using shimming tings attached to each pole face to reduce axisymmetric magnetic field inhomogeneity and using shims attached to the shimming tings to reduce 3D (three-dimensional) magnetic field inhomogeneity. What is needed is a magnet which is designed to better reduce magnetic field inhomogeneity which, in MRI applications, will improve imaging quality.

SUMMARY OF THE INVENTION

It is an object of the invention to provide a magnet with contoured opposing pole faces which permits the reduction of axisymmetric magnetic field inhomogeneity.

In a first embodiment, the magnet of the invention includes spaced-apart first and second pole pieces including generally opposing first and second pole faces. The first pole face has an axis extending generally towards the second pole face and has a surface region with two or more frustoconical surfaces. The frustoconical surfaces are generally coaxially aligned about the axis, and radially-adjacent frustoconical surfaces abut each other.

In a second embodiment, the magnet of the invention includes spaced-apart first and second pole pieces including generally opposing first and second pole faces. The first pole face has an axis extending generally towards the second pole face and has a surface region, wherein points on the surface region located an identical radial distance from the axis are also located a common axial distance along the axis, and wherein a graph of axial distance along the axis versus radial distance from the axis for such points is a curve having a continuous slope with at least two sign reversals.

Several benefits and advantages are derived from the invention. With both embodiments of the invention, a contoured pole face is provided which allows for a smoother magnetic field to better reduce axisymmetric magnetic field inhomogeneity. The prior-art shimming rings provided coarse shimming using a pole face having a surface region with a "step-function" shape when the pole face is viewed in cutaway from the side of the pole face. The first embodiment of the invention provides a smoother magnetic field using a pole face having a surface region with a shape of a line made up of sloped, straight line segments when viewed in cutaway from the side of the pole face. The second embodiment of the invention provides an even smoother magnetic field using a pole face having a surface region with a shape of a curve having a continuous slope when viewed in cutaway from the side of the pole face.

BRIEF DESCRIPTION OF THE DRAWINGS

The accompanying drawings illustrate two preferred embodiments of the present invention wherein.

DETAILED DESCRIPTION OF THE INVENTION

Figure 1:
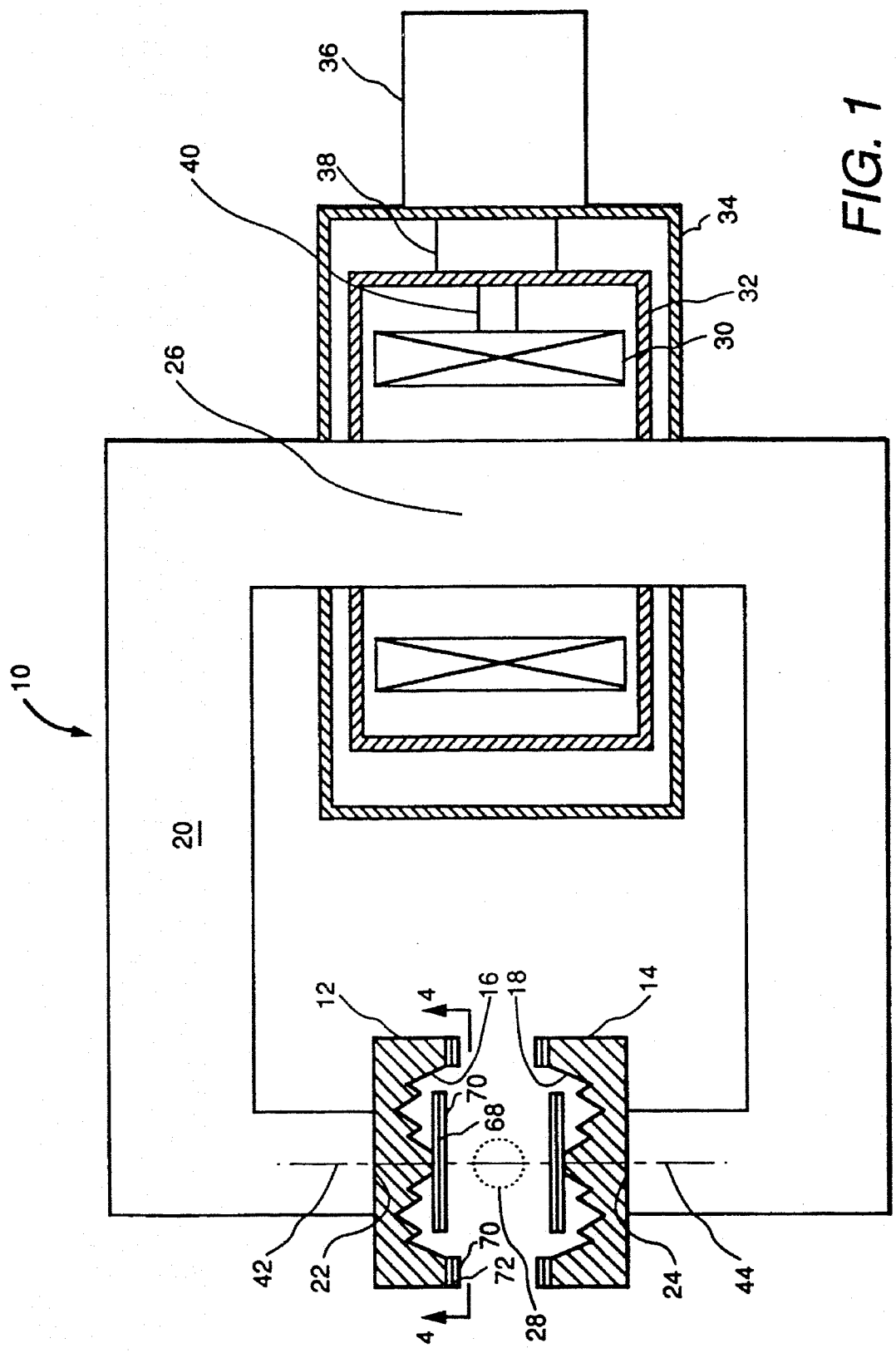
FIG. 1 is a side-elevational schematic view of a first preferred embodiment of the magnet of the invention with the pole pieces of the magnet, and the thermal shield and vacuum enclosure surrounding the superconductive coil, shown in section.

Referring now to the drawings, wherein like numerals represent like elements throughout, FIGS. 1–4 show a first preferred embodiment of the magnet 10 of the present invention. The magnet 10 includes spaced-apart first and second pole pieces 12 and 14 including generally opposing first and second pole faces 16 and 18. Preferably, the magnet 10 includes a "C"-shaped core 20 having two ends 22 and 24 and having a middle portion 26 located generally equidistant from the two ends and 24. In an exemplary embodiment, the first pole piece 12 is attached to one 22 of the two ends 22 and 24 of the core 20, and the second pole piece 14 is attached to the other 24 of the two ends 22 and 24 of the core 20. In some magnet designs the pole pieces are metallurgically fixed to the core while in other magnet designs the pole pieces are connected with removable bolts to the core. Typically, the core 20 and the pole pieces 12 and 14 are each made of a ferromagnetic material, such as iron.

In certain magnet applications, such as in MRI medical imaging, a high magnetic field strength is required in the imaging volume 28 (shown in dotted line) located between the two pole faces 16 and 18. Typically, this is achieved by employing a superconductive coil, such as the cryocooler-cooled superconductive coil 30 shown in FIG. 1, surrounding the middle portion 26 of the core 20. A thermal shield 32 is spaced apart from and generally surrounds the superconductive coil 30, and a vacuum enclosure 34 is spaced apart from and surrounds the thermal shield 32. A cryocooler coldhead 36 (such as that of a Gifford-McMahon cryocooler) has its first stage 38 in thermal contact with the thermal shield 32 and has its second stage 40 in thermal contact with the superconductive coil 30. For a niobiumtin superconductive coil 30, the second stage 40 would maintain the superconductive coil 30 at a temperature of generally ten Kelvin, and the first stage 38 would maintain the thermal shield 32 at a temperature of generally forty Kelvin. Additional superconductive coils (not shown in the figures) may be needed to achieve a high magnetic field strength without exceeding the critical current density of the superconductor being used in the coils, as is known to those skilled in the art.

In certain magnet applications, such as in MRI medical imaging, a low magnetic field inhomogeneity (as well as the previously discussed high magnetic field strength) is required in the imaging volume 28 located between the two pole faces 16 and 18. There is an axisymmetric magnetic field inhomogeneity introduced due to the existence of the pole pieces 12 and 14 themselves. The magnet 10 is designed to reduce such axisymmetric magnetic field inhomogeneity. The first pole face 16 has an axis 42 extending generally towards the second pole face 18. Preferably, the second pole face 18 is generally identical to the first pole face 16, the second pole face 18 has an axis 44 extending generally towards the first pole face 16, and the axis 44 of the second pole face 18 is generally coaxially aligned with the axis 42 of the first pole face 16. The first pole face 16 has a surface region 46 with a plurality of frustoconical surfaces 48a to 48f, wherein the frustoconical surfaces 48a to 48f are generally coaxially aligned about the axis 42 of the first pole face 16, and wherein radially-adjacent frustoconical surfaces (e.g., 48c and 48d) abut each other. Preferably, the frustoconical surfaces 48a to 48f cover a majority of the surface area of the first pole face 16. In an exemplary embodiment, the plurality of frustoconical surfaces 48a to 48f is at least five.

Figure 2:
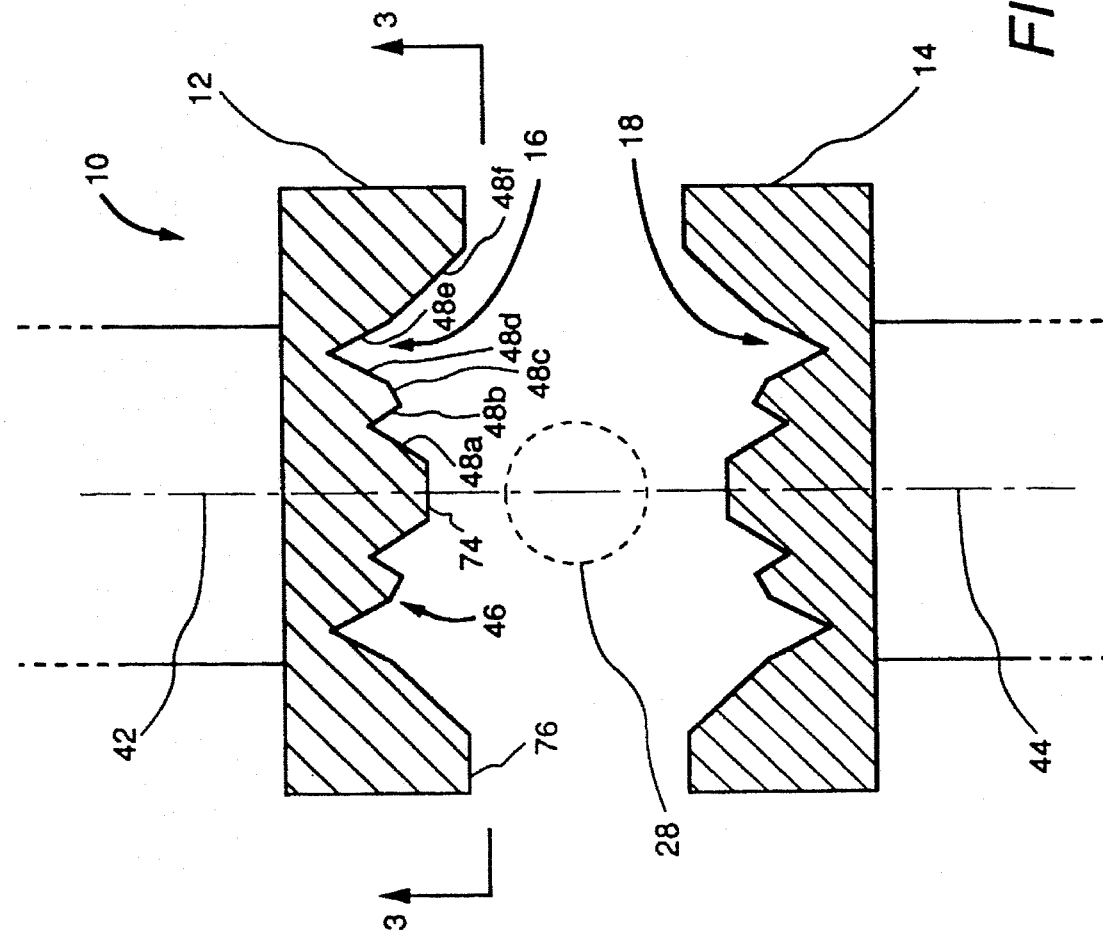
FIG. 2 is an enlarged view of the area of the pole pieces of the magnet of FIG. 1 with the shimming trays and shims removed for clarity.
Figure 3:
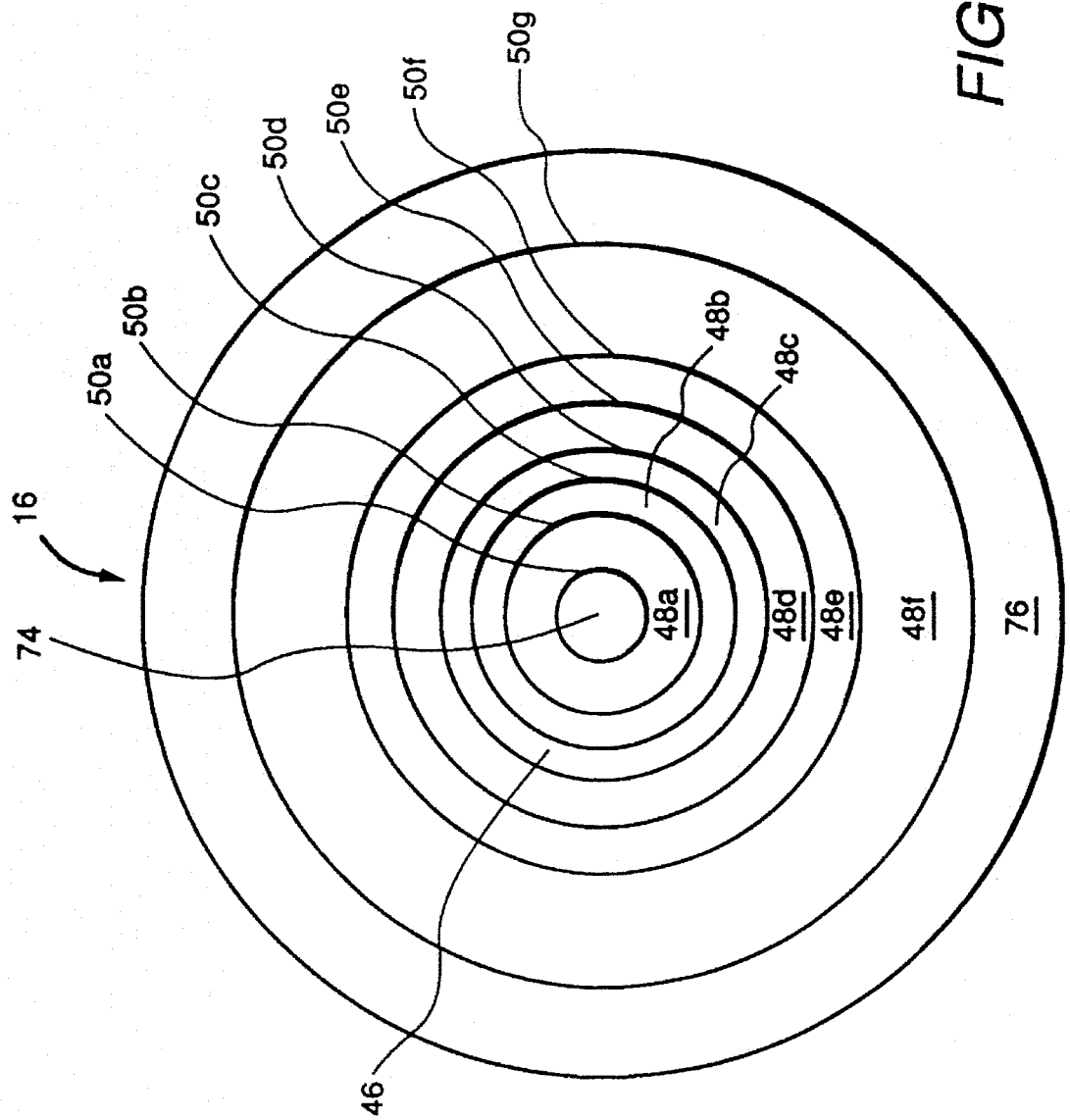
FIG. 3 is a view taken along lines 3—3 of FIG. 2.

The frustoconical surfaces 48a to 48f are seen most clearly in FIGS. 2 and 3. A prechosen number of circles have their circumferences 50a to 50g generally coaxially aligned with the axis 42 of the first pole face 16. Preferably, the radial distance (i.e., the distance along a line extending generally perpendicularly from the axis 42) between radially-adjacent circumferences is generally equal. For example, the radial distance from circumference 50b to circumference 50a is generally equal to the radial distance from circumference 50b to circumference 50c. The axial location (i.e., the location along the axis 42) between radially-adjacent circumferences is not equal. A frustoconical surface (e.g., 48b) connectingly extends between a pair of radially-adjacent circumferences (e.g., 50b and 50c). It is noted that a frustoconical surface (e.g., 48b) and the circles corresponding to its associated pair of radially-adjacent circumferences (e.g., 50b and 50c) together form a frustum of a truncated cone, as can be understood by those skilled in the art. The radial (i.e., perpendicular) location from the axis 42 for each circumference 50a to 50g is prechosen. The axial location along the axis 42 for each circumference 50a to 50g is determined so as to minimize the axisymmetric magnetic field inhomogeneity caused by the pole pieces 12 and 14 themselves. Such determination of the axial locations of the circumferences 50a to 50g may be made by one of ordinary skill in the art by using experimental or analytical techniques (preferably with the assistance of computers) for magnetic field mapping, such as that disclosed in U.S. Pat. No. 5,045,794 entitled "Method of Optimizing Passive Shim Placement in Magnetic Resonance Magnets" which was issued to Dorri et al. on Sep. 3, 1991. It is noted that the contours (i.e., frustoconical surfaces 48a to 48f) of the surface region 46 may be made by using conventional numerical control machining techniques.

Figure 5:
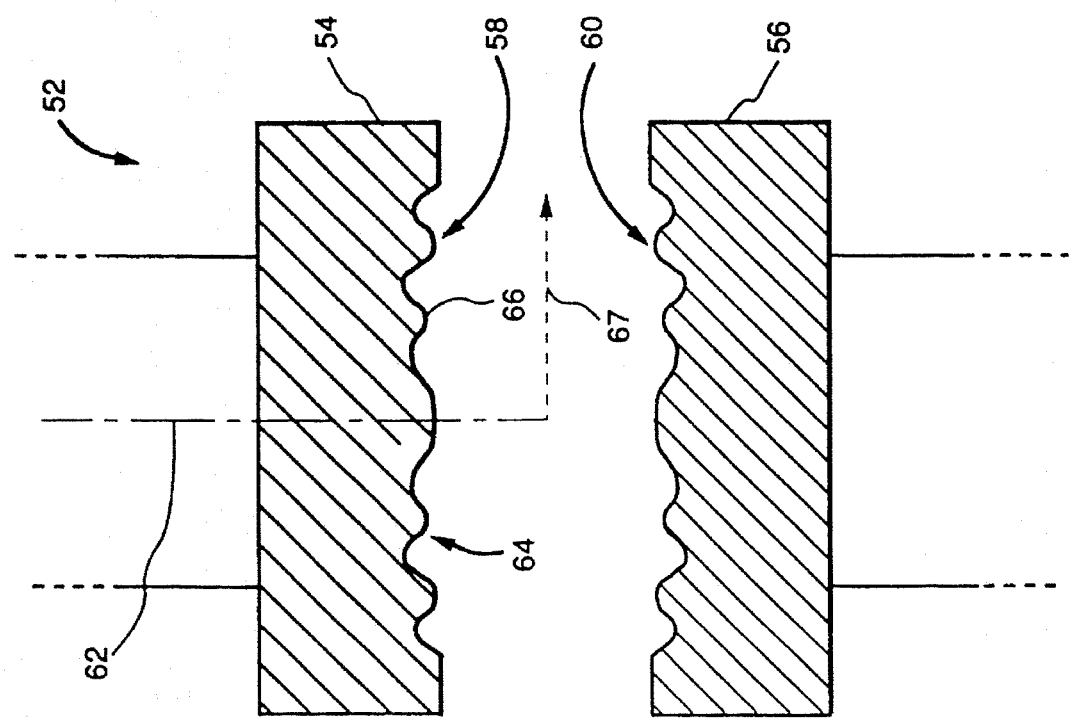
FIG. 5 is an enlarged side-elevational schematic view of the area of the pole pieces of a second preferred embodiment of the magnet of the invention with the pole pieces shown in section and with the shimming trays and shims removed for clarity.

In a second preferred embodiment of the invention, shown in FIG. 5, the magnet 52 includes spaced-apart first and second pole pieces 54 and 56 including generally opposing first and second pole faces 58 and 60. The first pole face 58 has an axis 62 extending generally towards the second pole face 60. The first pole face 58 has a surface region 64, wherein points on the surface region 64 located an identical radial (i.e., perpendicular) distance from the axis 62 are also located a common axial distance along the axis 62, and wherein a graph of axial distance along the axis 62 versus radial distance from the axis 62 for such points is a curve 66 having a continuous slope with at least two (and preferably at least five) sign reversals. Such graph can be seen as the curve 66 of FIG. 5, wherein the axis 62 and a radius (i.e., perpendicular) line 67 (shown as a dashed line) extending from the axis 62 form the axes of the graph. For a prechosen radial (i.e., perpendicular) location from the axis 62, the axial location along the axis 62 for each such point on the surface region 64 is determined so as to minimize the axisymmetric magnetic field inhomogeneity caused by the pole pieces 54 and 56 themselves. Such determination of the axial locations of such points may be made as previously described for the first preferred embodiment of the invention. It is noted that the contours of the surface region 64 may be made by using conventional numerical control machining techniques.

Alternatively, the surface region 64 of the magnet 52 of the second preferred embodiment of the invention can be derived from the surface region 46 of the magnet 10 of the first preferred embodiment of the invention by letting the radial distance of radially-adjacent circumferences 50a to 50g of the first preferred embodiment become very small so as to approach zero for all practical purposes. In the alternative, an approximation of the surface region 64 can be derived from the circumferences 50a to 50g of the first embodiment by passing a curve (determined from standard curve-fitting techniques) between two proximate points resulting from the intersection of radially-adjacent circumferences 50a to 50g and a plane which contains the axis 62.

It is seen that both preferred embodiments have contoured surface regions 46 and 64, which provide a smoother magnetic field to better reduce axisymmetric magnetic field inhomogeneity compared to previously-known shimming ring techniques, as can be appreciated by those skilled in the art.

Applicants designed (but have yet to build) an exemplary embodiment of the magnet 10 of the first embodiment of the invention using the principles of the present invention, previously disclosed herein, together with conventional magnetic field analysis, as is within the skill of the artisan. The magnet 10 was designed for a 0.3 Tesla imaging volume 28 having the shape of a sphere with a diameter of 10 centimeters. The peak-to-peak axisymmetric magnetic field inhomogeneity was reduced from a calculated value in excess of 10,000 parts per million (ppm) to a calculated value of 8 ppm. It is believed that conventional shimming ring techniques could not reasonably reduce the value to below a calculated value of 100 ppm.

Magnet 10 (as well as magnet 52) may still be left with a 3D (three-dimensional) magnetic field inhomogeneity due to its "C" shape and due to the location of its superconductive coil 30 which may be corrected for by using shim trays and shims. Typically the shim trays are made of a non-ferromagnetic material, such as fiberglass, and the shims are made of a ferromagnetic material, such as iron. Only the shimming of magnet 10 will be described. Preferably, magnet 10 also includes a generally circular shim tray 68 generally coaxially aligned with the axis 42, attached to the first pole face 16, and having shims 70. The magnet 10 further includes a generally annular shim tray 72 generally coaxially aligned with the axis 42, radially outwardly spaced apart from the circular shim tray 68, attached to the first pole face 16 and having shims 70. The annular shim tray 72 is axially disposed closer to the second pole face 18 than is the circular shim tray 68. This two-tray arrangement recognizes that the surface region 46 of the first pole face 16 will have its radially outermost portion extend axially closer to the second pole face 18 than will its radially innermost portion for proper shaping of the imaging volume 28. The two-tray arrangement therefore allows the shims 70 of the two trays 68 and 72 to be located closer to the surface region 46 for better shimming than would be possible using a single shim tray, as can be appreciated by those skilled in the art.

Magnet 10 has its first pole face 16 also include a plano-circular surface 74 generally coaxially aligned with the axis 42 and circumferentially abutting the radially innermost one 48a of the frustoconical surfaces 48a to 48f. The circular shim tray 68 axially abuts the plano-circular surface 74. Such plano-circular surface 74 is provided for ease in attaching the circular shim tray 68 to the first pole face 16. Magnet 10 additionally has its first pole face 16 further include a plano-annular surface 76 generally coaxially aligned with the axis 42 and circumferentially abutting the radially outermost one 48f of the frustoconical surfaces 48a to 48f. The annular shim tray 72 axially abuts the plano-annular surface 76. Such plano-annular surface 76 is provided for ease in attaching the annular shim tray 72 to the first pole face 16. The second pole piece 14 of magnet 10 would have similar shim trays and shims, as would the first and second pole pieces 54 and 56 of magnet 52.

Figure 4:
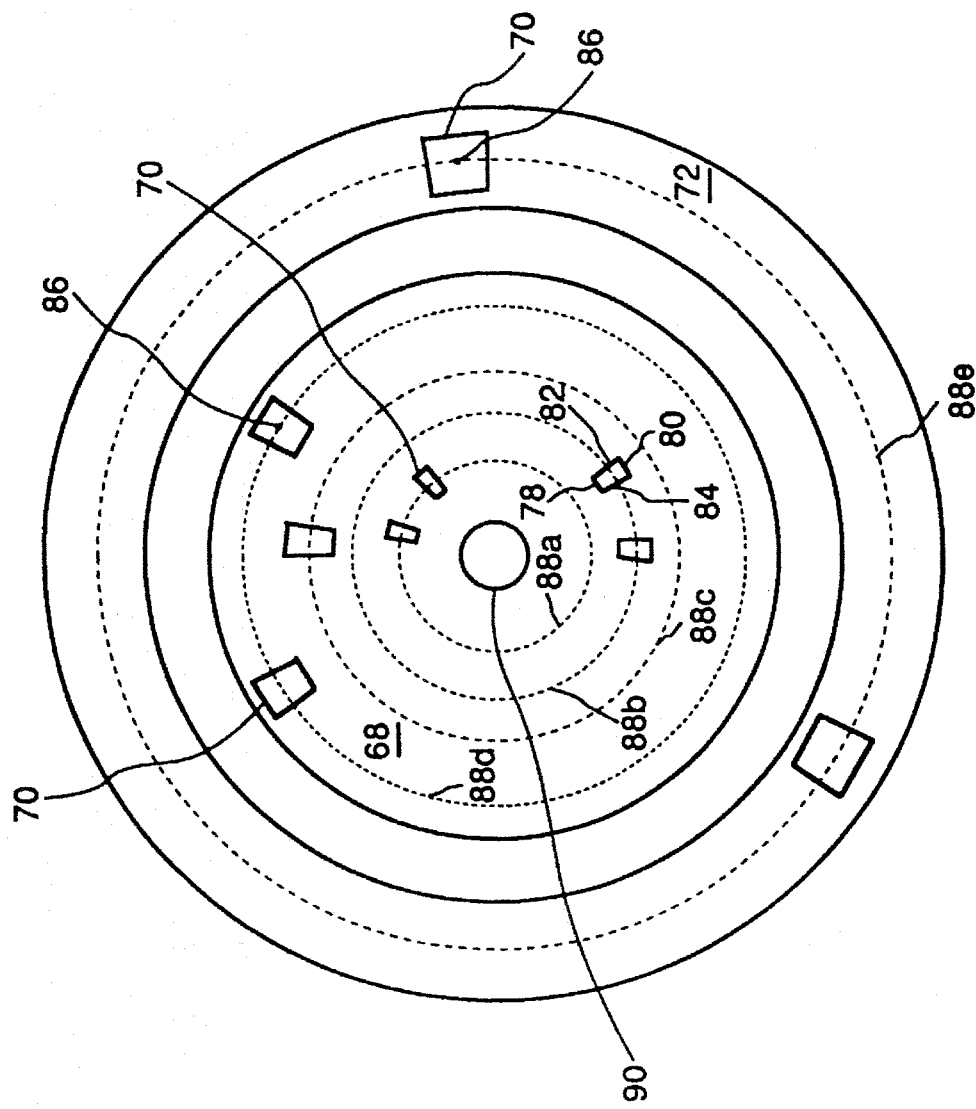
FIG. 4 a view taken along lines 4—4 of FIG. 1.

Preferably, as seen in FIG. 4, each of the shims 70 of the circular and annular shim trays 68 and 72 of magnet 10 has the shape of generally a trapezoid when viewed facing the first pole face 16. Each trapezoid has a shorter base 78, a longer base 80, first and second sides 82 and 84, and a geometric center point 86. The shorter base 78 is radially disposed closer to the axis 42 than is the longer base 80. The first side 82 is generally aligned along a radius line (not shown in the figures) drawn from the axis 42 to the first side 82, and the second side 84 is generally aligned along a radius line (not shown in the figures) drawn from the axis 42 to the second side 84. In an exemplary embodiment, the shims 70 of the circular shim tray 68 are arranged so that the geometric center points 86 (only one of which is shown in FIG. 4) of their trapezoids are disposed on the circumferences 88a to 88d (shown in dashed line) of imaginary concentric circles which are generally coaxially aligned with the axis 42, and the shims 70 of the annular shim tray 72 are arranged so that the geometric center points 86 (only one of which is shown in FIG. 4) of their trapezoids are disposed on the circumference 88e (shown in dashed line) of an imaginary circle which is generally coaxially aligned with the axis 42. The combination of the shape and arrangement of the shims 70 provides better shim coverage than that provided by previously-known shimming techniques. The actual locations of the individual shims 70 on the shim trays 68 and 72 (i.e., the locations of the geometric centers 86 of the individual shims 70 on the circumferences of the imaginary circles) are determined, along with their thicknesses, as previously described for axisymmetric shimming of the surface region 46 of the first pole face 16. Preferably, the trapezoids on the same circumference 88a to 88e have generally the same trapezoidal shape, and the trapezoids on different circumferences 88a to 88e have generally different trapezoidal shapes. Preferably, at least two shims 70 on the same circumference 88a to 88e have different thicknesses. For structural reasons, the circular shim tray 68 may be comprised of joined-together circular sectors (not shown), and the annular shim tray 72 may be comprised of joined-together annular arcs (not shown). It is noted that there may also be a central circular shim 90.

In Applicants' previously described magnet design, the size of the circle of shim 90 was prechosen, the sizes of the trapezoids of the shims 70 were prechosen, and the size of the trapezoids of the shims 70 on a particular circumference 88a to 88e were generally equal. The previously described principles of the present invention and conventional magnetic field analysis were used to determine the thickness of circular shim 90 on the circular shim tray 68 and the thicknesses and locations of the trapezoidal shims 70 on the circumferences 88a to 88e of the imaginary circles on the circular and annular shim trays 68 and 72, as is within the skill of the artisan. The peak-to-peak 3D (three-dimensional) magnetic field inhomogeneity was reduced from a calculated value of over 3,000 parts per million (ppm) to a calculated value of 23 ppm. It is believed that conventional shimming techniques could not reach this level.

The foregoing description of two preferred embodiments of the invention has been presented for purposes of illustration. It is not intended to be exhaustive or to limit the invention to the precise form disclosed, and obviously many modifications and variations are possible in light of the above teaching. For example, the surface region 46 of the first pole face 16 of magnet 10 may have a plano-annular surface, similar to plano-annular surface 76, connecting a radially-adjacent pair of frustoconical surfaces 48a to 48f, if required for better reduction of the axisymmetric magnetic field inhomogeneity of the magnet. It is intended that the scope of the invention be defined by the claims appended hereto.

We claim:

1. A magnet comprising spaced-apart first and second pole pieces including generally opposing first and second pole faces, said first pole face having an axis extending generally towards said second pole face and having a surface region with a plurality of frustoconical surfaces, wherein said frustoconical surfaces are generally coaxially aligned about said axis, wherein radially-adjacent said frustoconical surfaces abut each other, and wherein said frustoconical surfaces cover a majority of the surface area of said first pole face, and also including a generally circular shim tray generally coaxially aligned with said axis attached to said first pole face, and having shims.

2. The magnet of claim 1, also including a generally annular shim tray generally coaxially aligned with said axis, radially outwardly spaced apart from said circular shim tray, attached to said first pole face, and having shims, and wherein said annular shim tray is axially disposed closer to said second pole face than is said circular shim tray.

3. The magnet of claim 2, wherein said first pole face also includes a plano-circular surface generally coaxially aligned with said axis and circumferentially abutting the radially innermost one of said frustoconical surfaces, said circular shim tray axially abutting said plano-circular surface.

4. The magnet of claim 3, wherein said first pole face also includes a plano-annular surface generally coaxially aligned with said axis and circumferentially abutting the radially outermost one of said frustoconical surfaces, said annular shim tray axially abutting said plano-annular surface.

5. The magnet of claim 4, wherein each of said shims of said circular and said annular shim trays has a shape of generally a trapezoid when viewed facing said first pole face, said trapezoid having a shorter base, a longer base, and first and second sides, wherein said shorter base is radially disposed closer to said axis than is said longer base, wherein said first side is generally aligned along a radius line drawn from said axis to said first side, and wherein said second side is generally aligned along a radius line drawn from said axis to said second side.

6. The magnet of claim 5, wherein said plurality of frustoconical surfaces is at least five.

7. The magnet of claim 6, also including a "C"-shaped core having two ends, and wherein said first pole piece is attached to one of said two ends of said core, said second pole face is generally identical to said first pole face, said second pole face has an axis extending generally towards said first pole face, said axis of said second pole face is generally coaxially aligned with said axis of said first pole face, and said second pole piece is attached to the other of said two ends of said core.

8. The magnet of claim 7, wherein said core has a middle portion located generally equidistant from said two ends, and also including a cryocooler-cooled superconductive coil surrounding said middle portion of said core.

9. The magnet of claim 1 wherein said pole pieces are connected by a ferromagnetic core with a cryocooler-cooled superconductive coil positioned contiguous to said ferromagnetic core.

10. The magnet of claim 9 wherein said superconductive coil is positioned around the middle portion of said ferromagnetic core.

11. The magnet of claim 10 wherein said superconductive coil is niobium-tin.

12. The magnet of claim 10 wherein said shims are secured on at least one shim tray located contiguous to said first pole face.

* * * * *